(12) United States Patent
Park et al.

(10) Patent No.: US 11,489,041 B2
(45) Date of Patent: Nov. 1, 2022

(54) SEMICONDUCTOR DEVICE AND MANUFACTURING METHOD THEREOF

(71) Applicant: Research & Business Foundation Sungkyunkwan University, Suwon-si (KR)

(72) Inventors: Jin Hong Park, Hwaseong-si (KR); Kil Su Jung, Hwaseong-si (KR); Keun Heo, Yongin-si (KR); Sung Jun Kim, Incheon (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/916,455

(22) Filed: Jun. 30, 2020

(65) Prior Publication Data
US 2021/0005710 A1 Jan. 7, 2021

(30) Foreign Application Priority Data

Jul. 1, 2019 (KR) .................. 10-2019-0078909

(51) Int. Cl.
*H01L 29/06* (2006.01)
*H01L 29/66* (2006.01)
(Continued)

(52) U.S. Cl.
CPC ........ *H01L 29/0611* (2013.01); *H01L 29/401* (2013.01); *H01L 29/42356* (2013.01);
(Continued)

(58) Field of Classification Search
CPC .............. H01L 29/0611; H01L 29/401; H01L 29/42356; H01L 29/516; H01L 29/6684;
(Continued)

(56) References Cited

U.S. PATENT DOCUMENTS 6,852,602 B2\* 2/2005 Kanzawa .............. H01L 29/155
257/11
9,859,416 B2\* 1/2018 Mori ................. H01L 29/66681
(Continued)

FOREIGN PATENT DOCUMENTS

JP 10-79518 A 3/1998
JP 10079518 A \* 3/1998
(Continued)

OTHER PUBLICATIONS

Korean Office Action dated Dec. 17, 2020 in corresponding Korean Patent Application No. 10-2019-0078909 (2 pages in Korean).

*Primary Examiner* — Sheikh Maruf
(74) *Attorney, Agent, or Firm* — NSIP Law

(57) ABSTRACT

A semiconductor device according to an embodiment may include a board, an insulation layer disposed on the board, a threshold voltage control layer disposed on the insulation layer, a first semiconductor layer disposed on the threshold voltage control layer, and a second semiconductor layer disposed on the threshold voltage control layer to cover a portion of the first semiconductor layer. A negative differential resistance device according to an embodiment has an advantageous effect in that the gate voltage enables a peak voltage to be freely controlled within an operation range of the device by forming the threshold voltage control layer.

14 Claims, 21 Drawing Sheets

(51) Int. Cl.
*H01L 29/423* (2006.01)
*H01L 29/51* (2006.01)
*H01L 29/78* (2006.01)
*H01L 29/40* (2006.01)

(52) U.S. Cl.
CPC ........ *H01L 29/516* (2013.01); *H01L 29/6684* (2013.01); *H01L 29/78391* (2014.09)

(58) Field of Classification Search
CPC ............. H01L 29/78391; H01L 29/083; H01L 29/0834; H01L 29/1606; H01L 29/42312; H01L 29/7391; H01L 47/02; H01L 21/02315; H01L 21/823418; H01L 21/823437; H01L 29/40111; H01L 29/40117; H01L 47/005
USPC ........................................................ 257/288
See application file for complete search history.

(56) References Cited

U.S. PATENT DOCUMENTS

| | | | | |
|---|---|---|---|---|
| 10,304,844 | B1* | 5/2019 | Balakrishnan | H01L 29/7884 |
| 2009/0169919 | A1* | 7/2009 | Garcia | C23C 14/5806 |
| | | | | 428/688 |
| 2009/0174435 | A1* | 7/2009 | Stan | B82Y 10/00 |
| | | | | 257/14 |
| 2014/0106523 | A1* | 4/2014 | Koldiaev | H01L 27/088 |
| | | | | 438/212 |
| 2014/0131626 | A1* | 5/2014 | Lee | B82Y 40/00 |
| | | | | 252/500 |
| 2014/0175458 | A1* | 6/2014 | Ahn | H01L 29/1606 |
| | | | | 257/77 |
| 2014/0273397 | A1* | 9/2014 | Rodder | H01L 29/7848 |
| | | | | 438/400 |
| 2015/0262819 | A1* | 9/2015 | Motai | H01L 29/0611 |
| | | | | 257/194 |
| 2015/0364589 | A1* | 12/2015 | Lee | H01L 21/28512 |
| | | | | 257/29 |
| 2017/0005162 | A1* | 1/2017 | Noh | H01L 27/0886 |
| 2017/0025532 | A1* | 1/2017 | Mori | H01L 29/7835 |
| 2017/0263717 | A1* | 9/2017 | Lin | H01L 29/1095 |
| 2017/0271510 | A1* | 9/2017 | Wang | H01L 27/11582 |
| 2018/0102431 | A1* | 4/2018 | Mori | H01L 21/02255 |
| 2019/0378925 | A1* | 12/2019 | Shinohara | H01L 29/7824 |

FOREIGN PATENT DOCUMENTS

| | | |
|---|---|---|
| JP | 2015-31666 A | 2/2015 |
| JP | 2015-031666 A | 2/2015 |
| KR | 10-0170059 B1 | 2/1999 |
| KR | 10-2014 0004855 A | 1/2014 |
| KR | 10-1476348 B1 | 12/2014 |
| KR | 10-2017-0109457 A | 9/2017 |
| KR | 10-2018-0135350 A | 12/2018 |
| KR | 10-2020-0052138 A | 5/2020 |
| KR | 10-2217423 B1 | 2/2021 |

* cited by examiner

[FIG. 1]
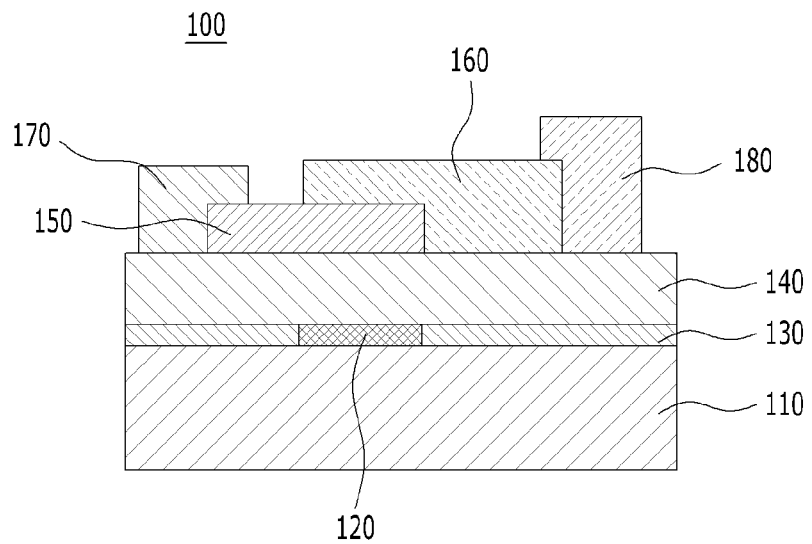
[FIG. 2]
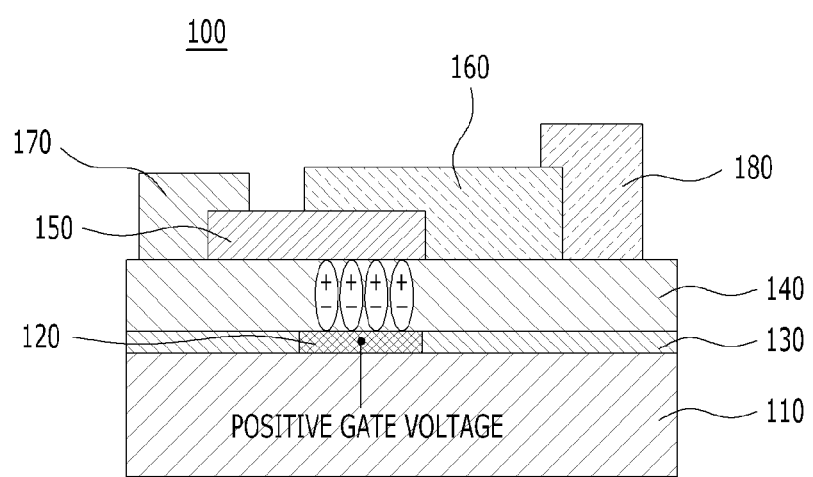

[FIG. 3]
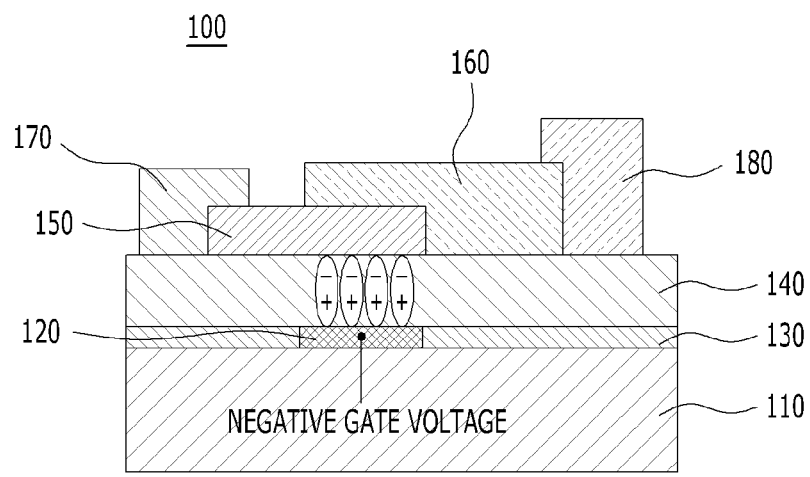
[FIG. 4]
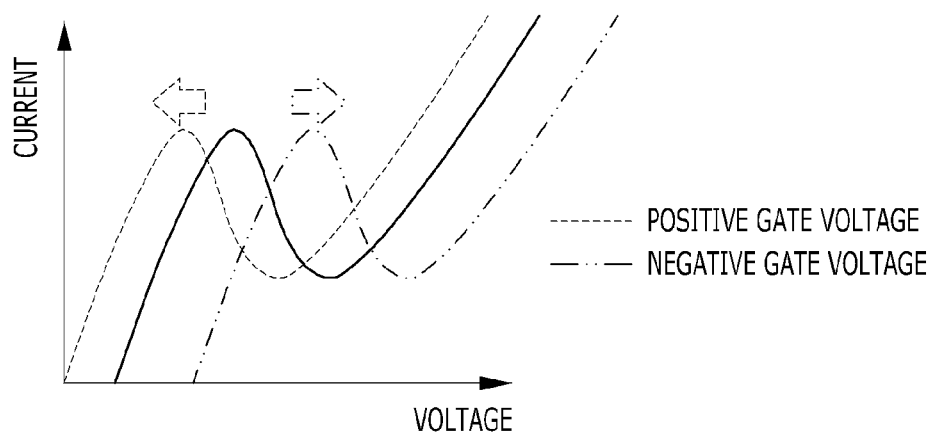

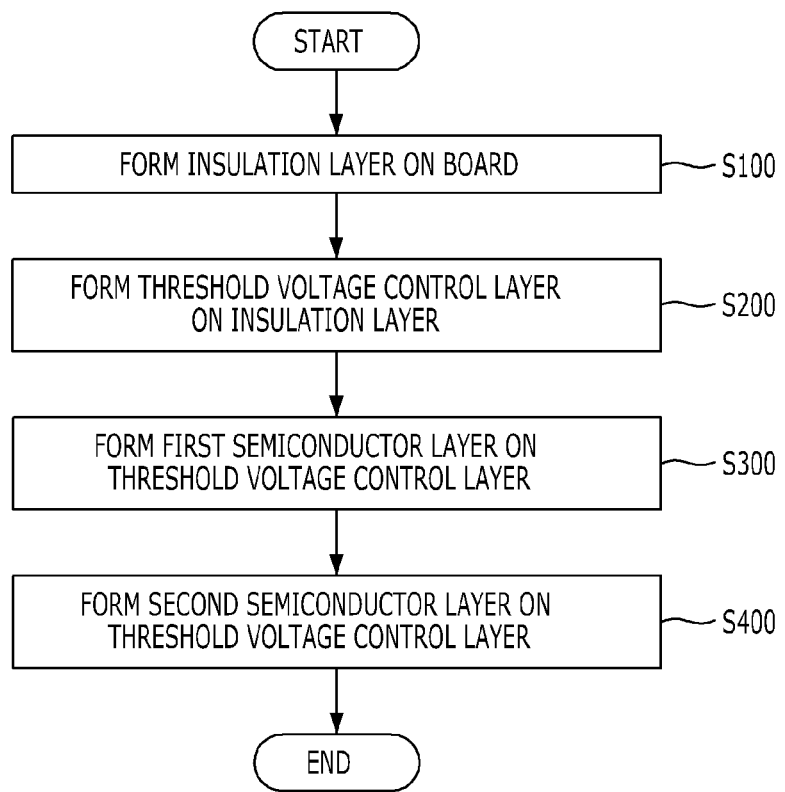
[FIG. 5]

[FIG. 6]
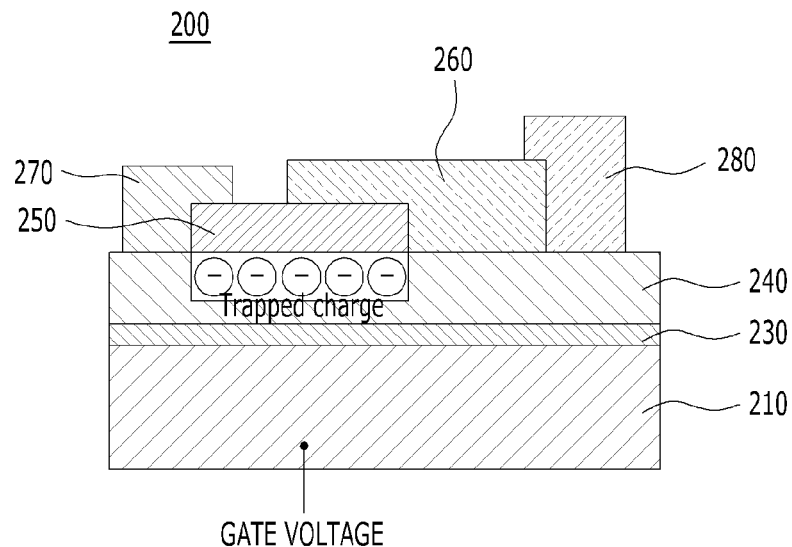
[FIG. 7]
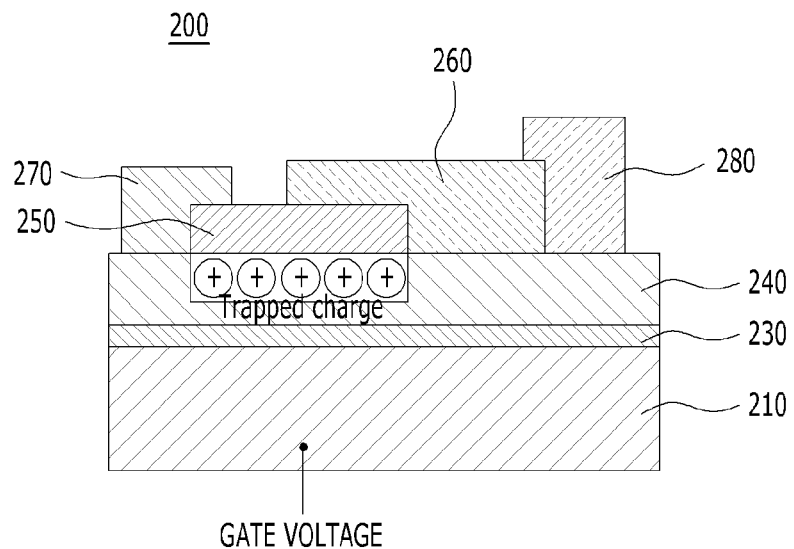

[FIG. 8]
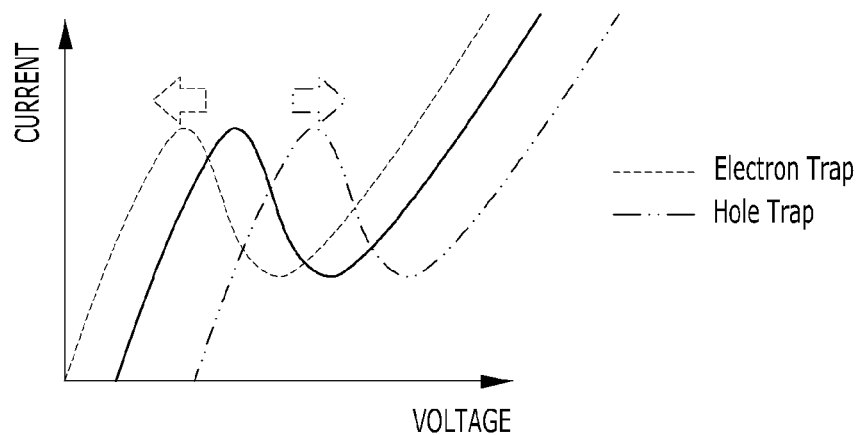
[FIG. 9]
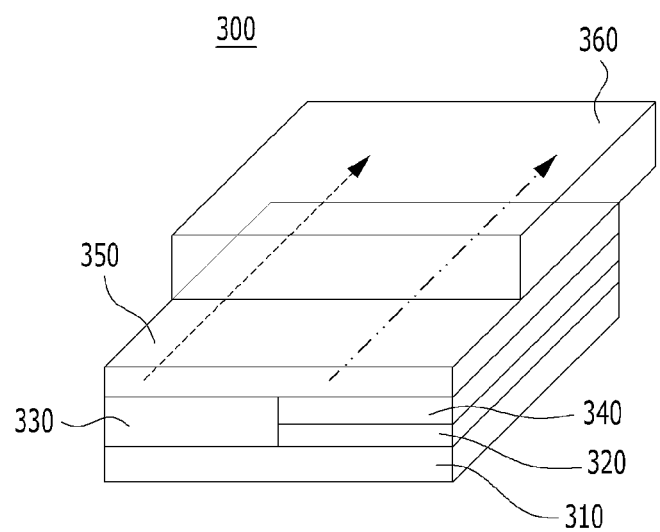

[FIG. 10]
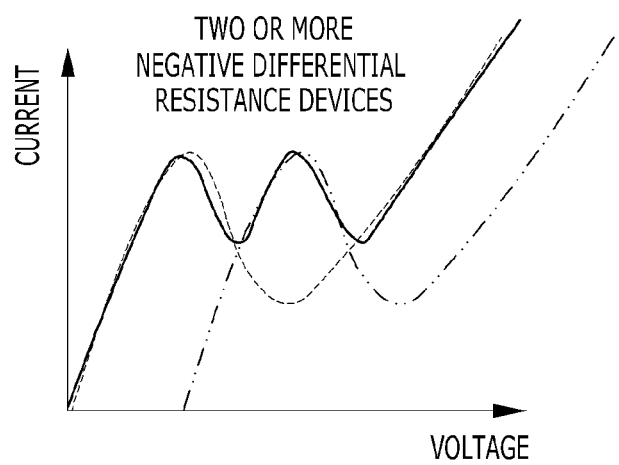
[FIG. 11]
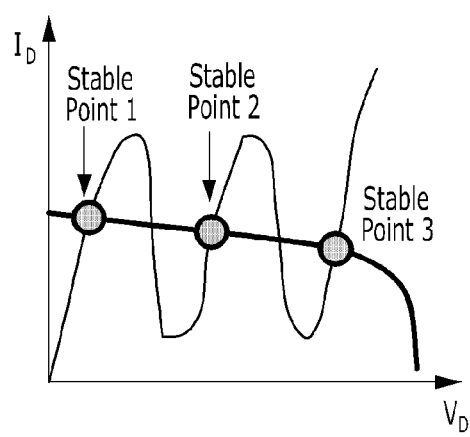

[FIG. 12]
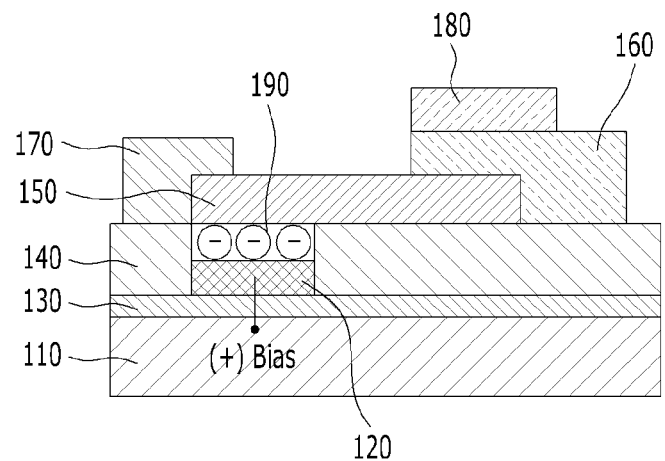
[FIG. 13]
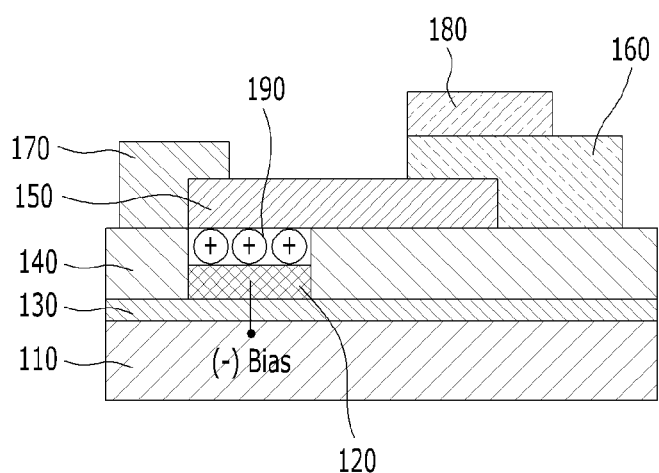

[FIG. 14]
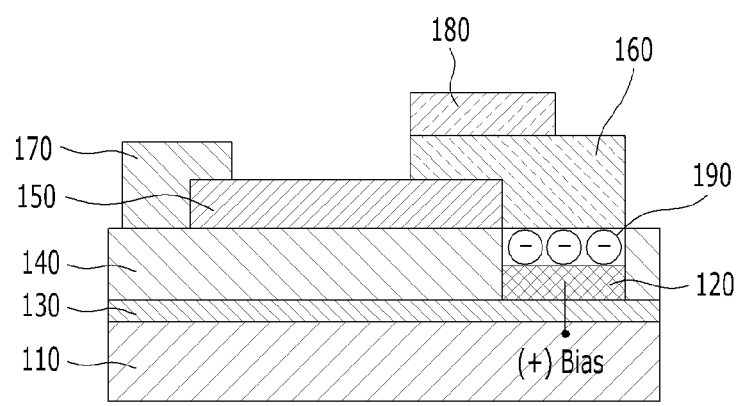
[FIG. 15]
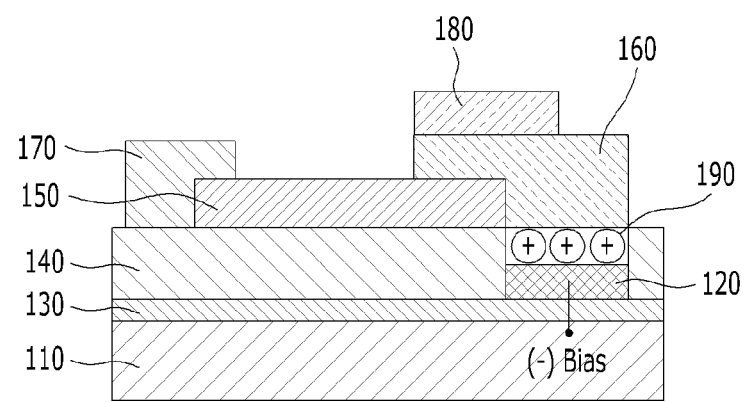

[FIG. 16]
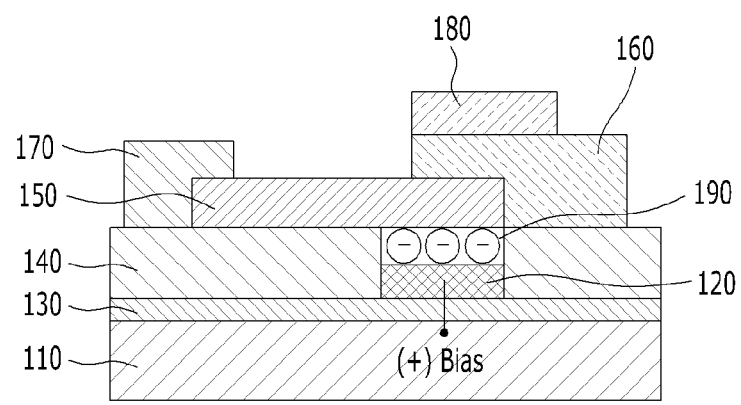
[FIG. 17]
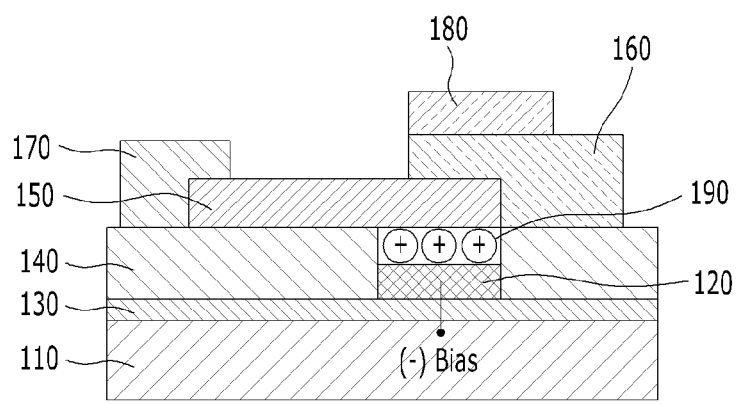

[FIG. 18]
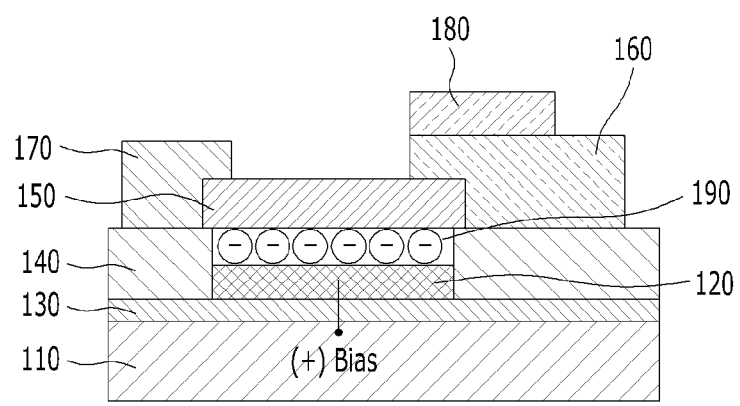
[FIG. 19]
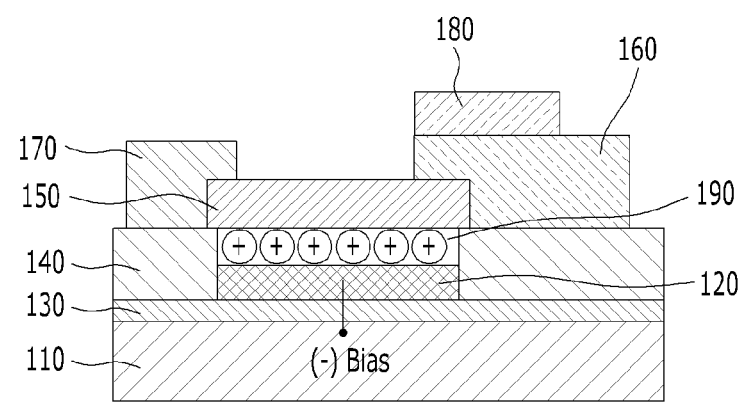

[FIG. 20]
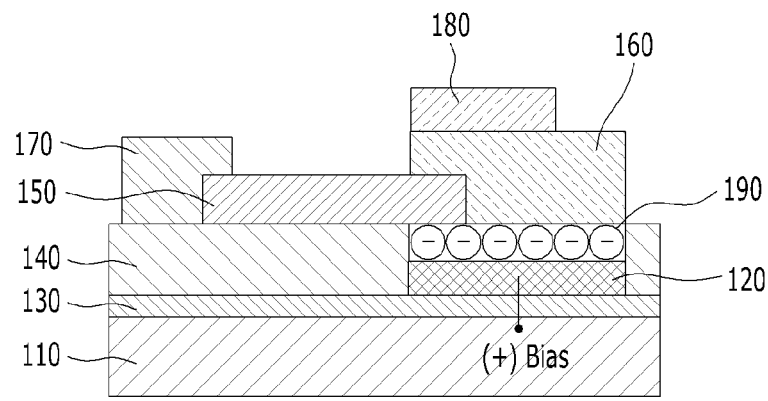
[FIG. 21]
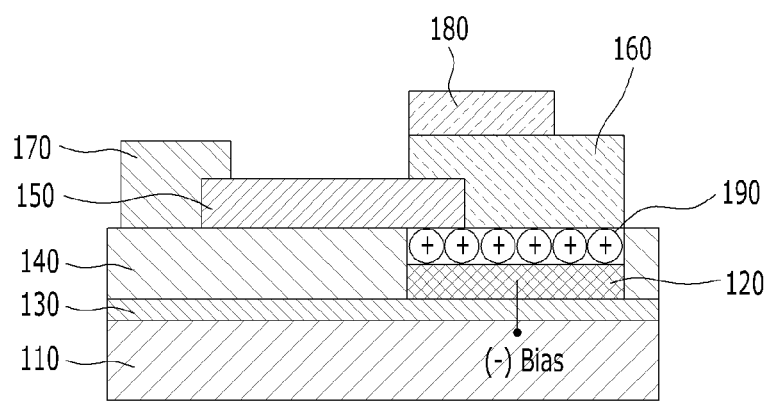

[FIG. 22]
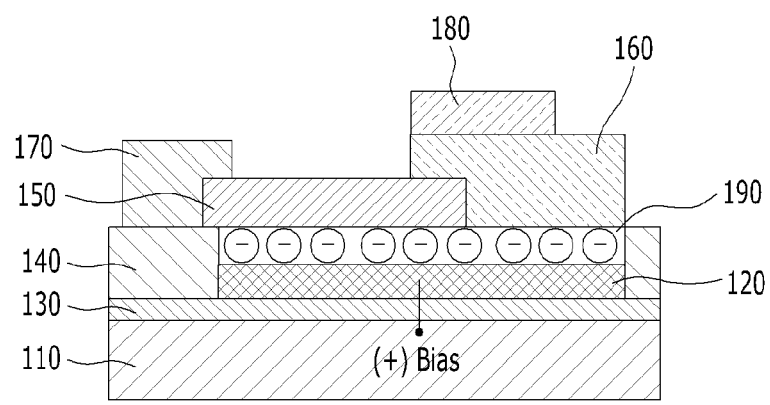
[FIG. 23]
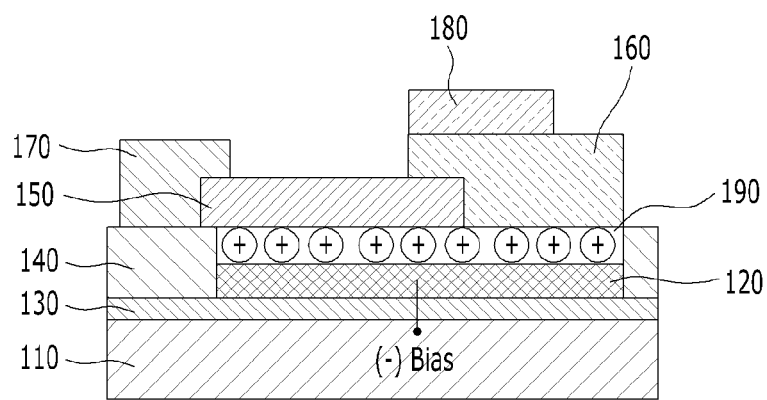

[FIG. 24]
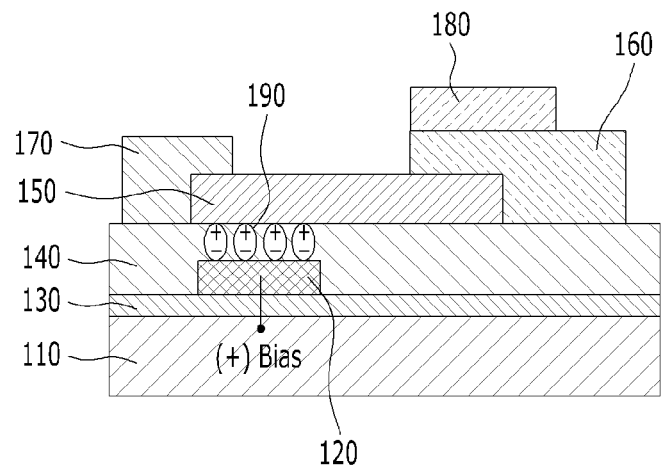
[FIG. 25]
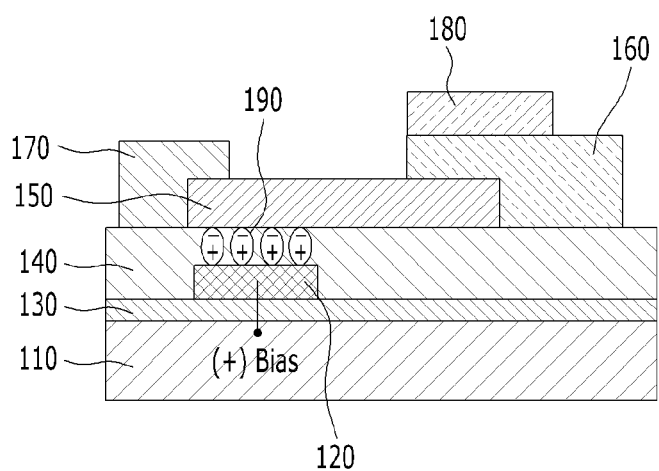

[FIG. 26]
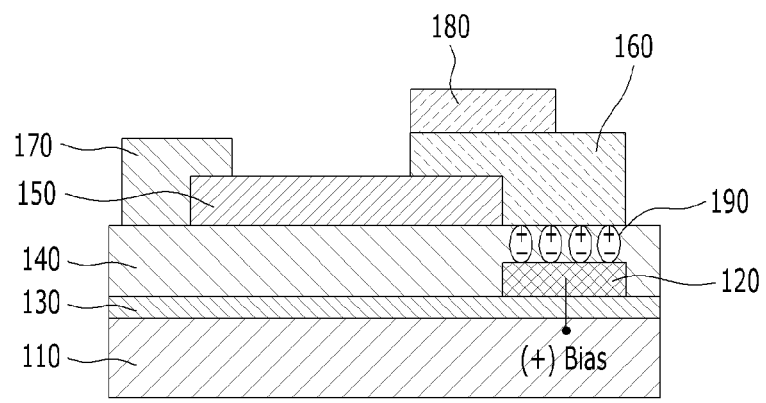
[FIG. 27]
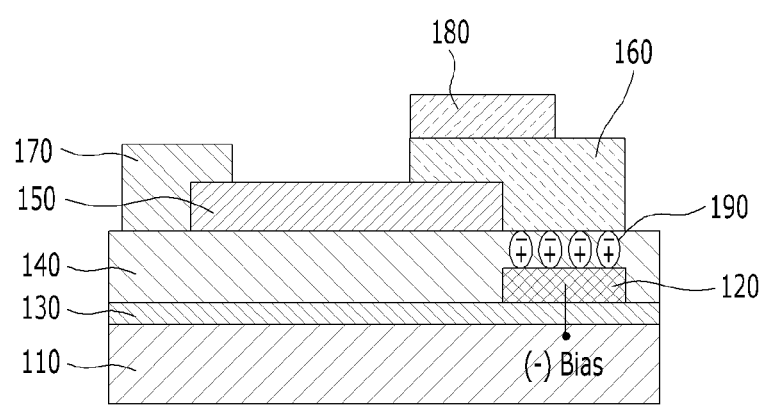

[FIG. 28]
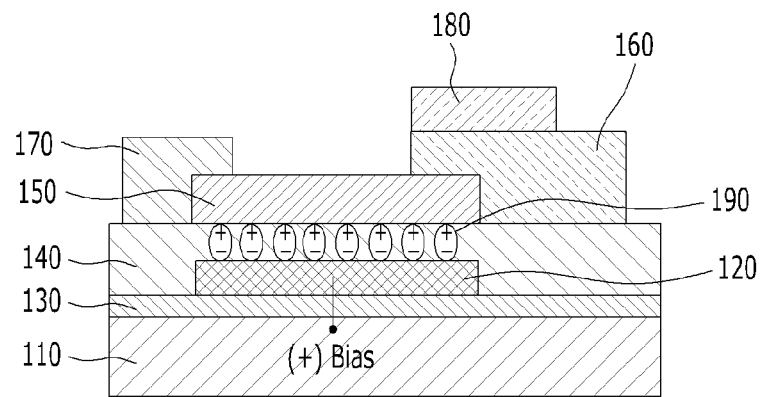
[FIG. 29]
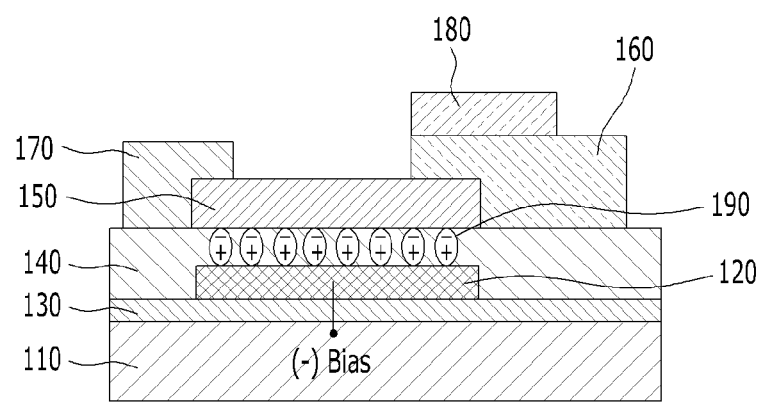

[FIG. 30]
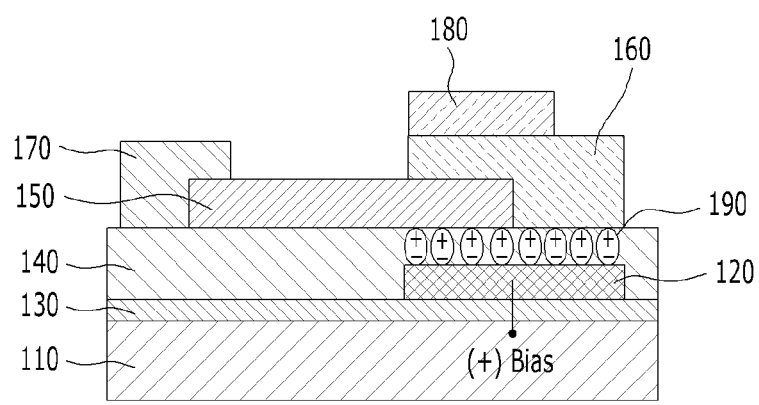
[FIG. 31]
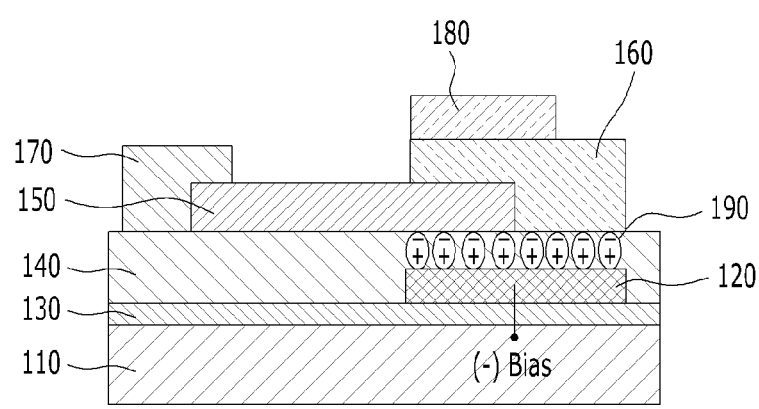

[FIG. 32]
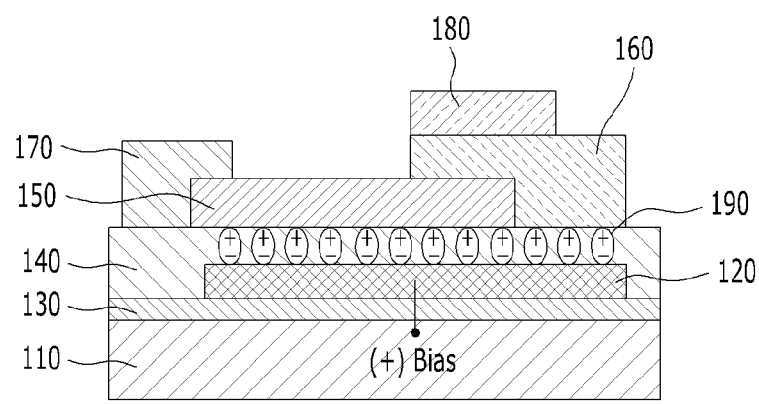
[FIG. 33]
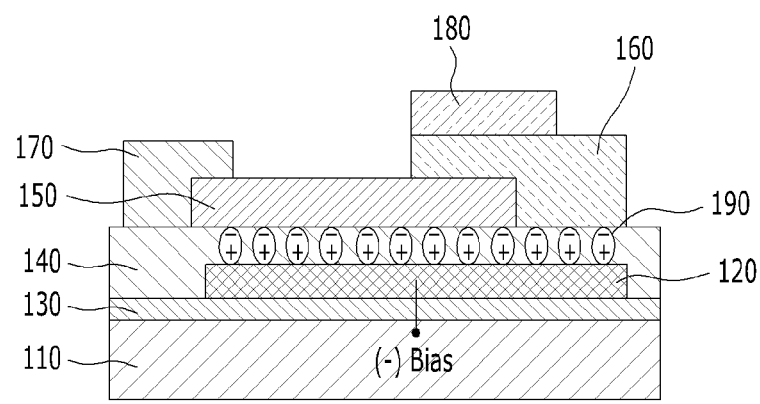

[FIG. 34]
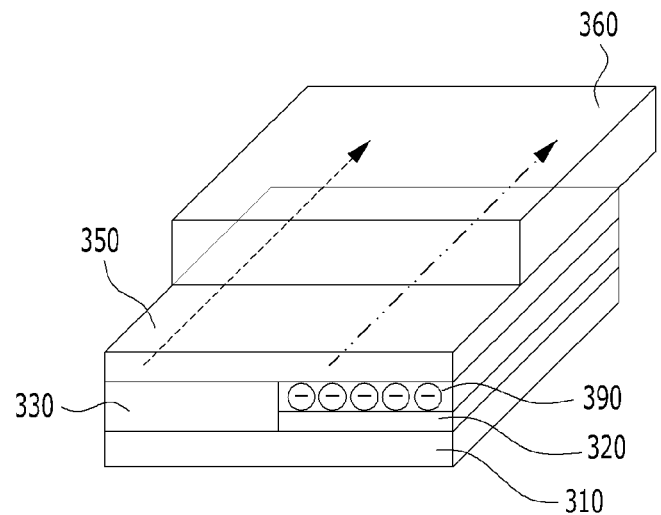
[FIG. 35]
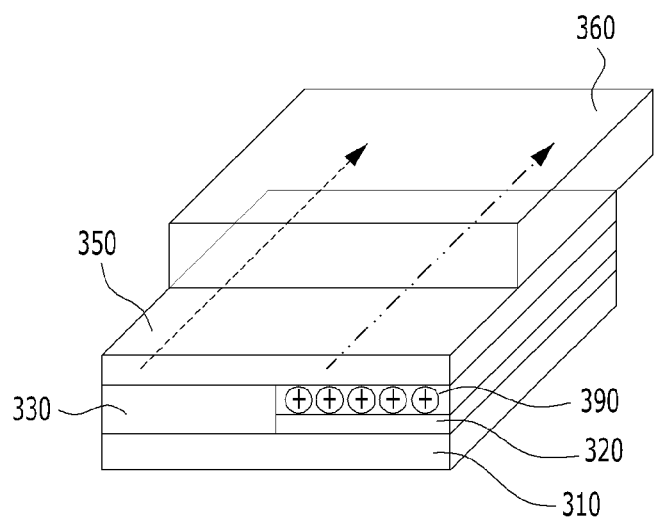

[FIG. 36]
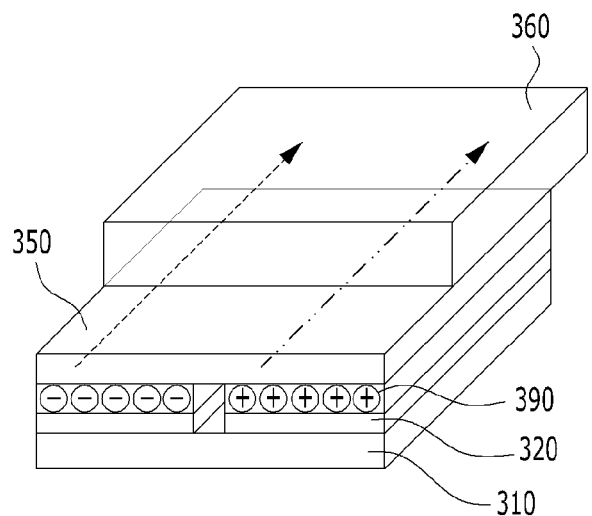
[FIG. 37]
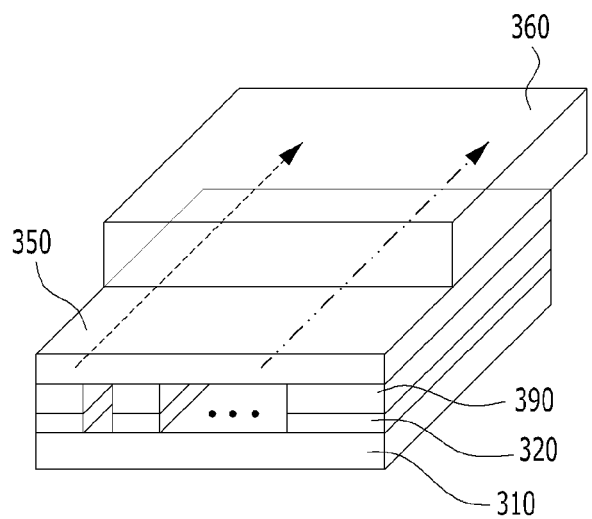

[FIG. 38]
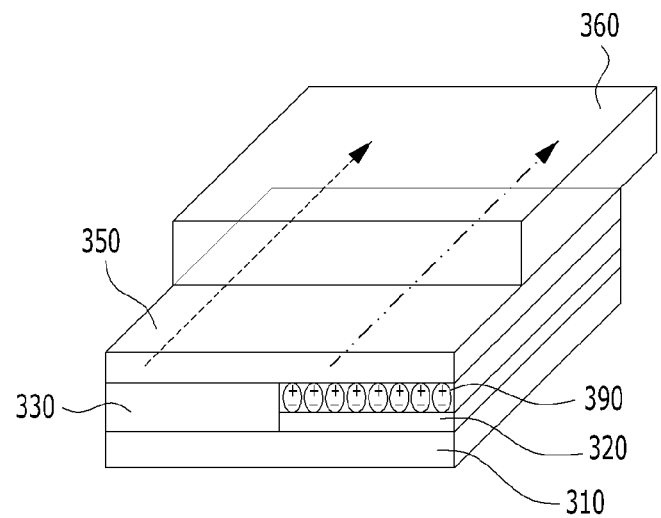
[FIG. 39]
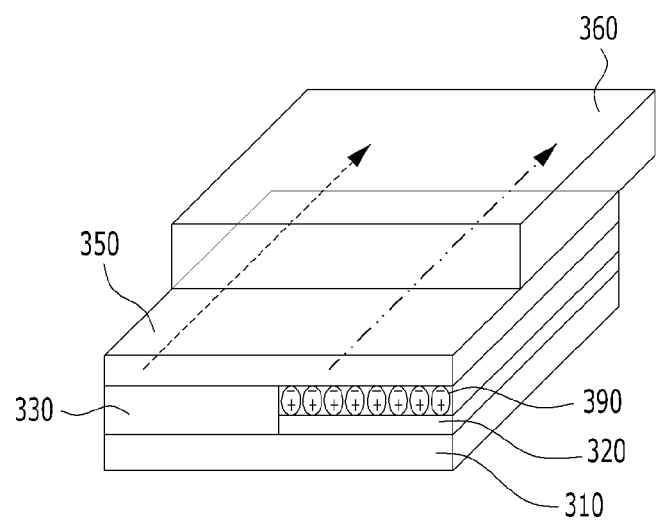

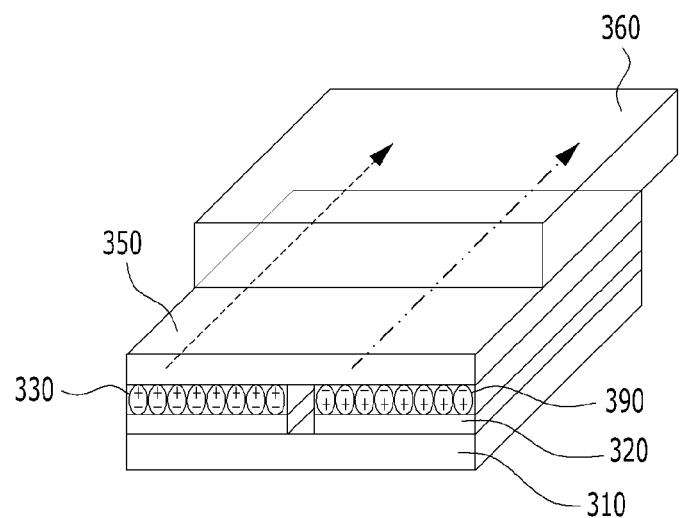
[FIG. 40]

SEMICONDUCTOR DEVICE AND MANUFACTURING METHOD THEREOF

CROSS-REFERENCE TO RELATED APPLICATIONS

This application claims the priority of Korean Patent Application No. 10-2019-0078909 filed on Jul. 1, 2019, in the Korean Intellectual Property Office, the disclosure of which is incorporated herein by reference.

BACKGROUND

Field

Embodiments disclosed here relate to a semiconductor device.

Description of the Related Art

Negative differential resistance (NDR) devices show a characteristic that a current decreases on the contrary in spite of an increase in a voltage applied conversely to a usual case. Devices showing this NDR characteristic include an Esaki diode, a resonance tunneling diode, a single electron transistor, and the like. Since the devices use tunneling, the devices have a high-speed operation characteristic and have an advantage in that multi-valued logic circuits may be implemented.

However, the negative differential resistance device in the related art has a fixed peak voltage. Consequently, there is a limit in increasing the implemented multi-valued logic circuits when only a single peak of the negative differential resistance device is used. Therefore, it is necessary to provide the negative differential resistance device having multiple peaks.

SUMMARY

In order to solve the above-described problem, embodiments disclosed herein aim to provide a semiconductor device capable of controlling a peak voltage.

According to an embodiment, a semiconductor device may include a board, an insulation layer disposed on the board, a threshold voltage control layer disposed on the insulation layer, a first semiconductor layer disposed on the threshold voltage control layer, and a second semiconductor layer disposed on the threshold voltage control layer to cover a portion of the first semiconductor layer.

The threshold voltage control layer may include a ferroelectric.

The semiconductor device may further include a gate electrode disposed on the board. The gate electrode may be disposed and surrounded by the insulation layer.

The gate electrode may be disposed and vertically overlapped with the first semiconductor layer and the second semiconductor layer.

A width of the gate electrode may correspond to a width of a region where the first semiconductor layer and the second semiconductor layer overlap each other.

The threshold voltage control layer may include graphene subjected to plasma treatment.

The semiconductor device may further include a gate electrode disposed between the board and the insulation layer.

The semiconductor device may further include a source electrode disposed on one side on the threshold voltage control layer, and a drain electrode disposed on the other side on the threshold voltage control layer.

The semiconductor device may further include a gate electrode disposed on the board. The gate electrode may be disposed on the insulation layer.

A trap layer may be formed between the gate electrode and the first semiconductor layer.

The trap layer may be disposed and partially or entirely overlapped with the first semiconductor layer.

The trap layer may include one polarity or two polarities.

A trap layer may be formed between the gate electrode and the second semiconductor layer.

The trap layer may be formed between the gate electrode and the first semiconductor layer and the second semiconductor layer.

In addition, a semiconductor device according to an embodiment may include a board, a gate electrode disposed on the board, a threshold voltage control layer disposed on the gate electrode, an insulation layer disposed on the board, a first semiconductor layer disposed on the insulation layer and the threshold voltage control layer, and a second semiconductor layer disposed on the first semiconductor layer.

The insulation layer may be in contact with a side surface of the gate electrode and a side surface of the threshold voltage control layer.

A thickness of the insulation layer may correspond to the sum of a thickness of the gate electrode and a thickness of the threshold voltage control layer.

In addition, a semiconductor device according to an embodiment may include a board, a gate electrode disposed in a partial region on the board, a trap layer disposed on the gate electrode, a first semiconductor layer disposed on the insulation layer and the trap layer, and a second semiconductor layer disposed on the first semiconductor layer.

The semiconductor device may further include an insulation layer disposed on the board. A side surface of the insulation layer may be disposed on a side surface of the gate electrode and a side surface of the trap layer.

The gate electrode and the trap layer may be disposed apart from each other by forming a plurality of layers.

In addition, a manufacturing method of a semiconductor device according to an embodiment may include forming an insulation layer on a board, forming a first electrode on the board, forming a threshold voltage control layer on the first electrode and the insulation layer, forming a first semiconductor layer on the threshold voltage control layer, forming a second semiconductor layer on the threshold voltage control layer to cover a portion of the first semiconductor layer, forming a second electrode on one side on the threshold voltage control layer, and forming a third electrode on the other side on the threshold voltage control layer.

A negative differential resistance device according to an embodiment has an advantageous effect in that the gate voltage enables a peak voltage to be freely controlled within an operation range of the device by forming the threshold voltage control layer.

In addition, the negative differential resistance device according to the embodiment may generate a voltage trap or a polarization phenomenon by the threshold voltage control layer. Accordingly, it is possible to control a threshold voltage of the negative differential resistance device.

In addition, according to the embodiment, a structure that may be controlled by a gate voltage is implemented only in a portion of a channel region or a junction region of the negative differential resistance device. Accordingly, two or more negative differential resistance devices having mutually different properties in one device may be implemented.

In addition, according to the embodiment, there is an advantageous effect equivalent to an advantageous effect that two or more negative differential resistance devices are connected in parallel in one device. Accordingly, the negative differential resistance device having multiple peaks in terms of operation characteristics may be implemented.

In addition, according to the embodiment, a peak-valley position and the number of the negative differential resistance devices may be controlled in accordance with a magnitude of a gate voltage. Accordingly, when a memory unit device is implemented, a state and the number of memories may be changed only by using the gate voltage.

BRIEF DESCRIPTION OF THE DRAWINGS

The above and other aspects, features and other advantages of the present disclosure will be more clearly understood from the following detailed description taken in conjunction with the accompanying drawings, in which:

FIG. 1 is a cross-sectional view illustrating a semiconductor device according to a first embodiment;

FIGS. 2 and 3 are cross-sectional views illustrating an operation of the semiconductor device according to the first embodiment;

FIG. 4 is a graph illustrating a voltage characteristic of the semiconductor device according to the first embodiment;

FIG. 5 is a block diagram illustrating a manufacturing method of the semiconductor device according to the first embodiment;

FIGS. 6 and 7 are cross-sectional views illustrating a semiconductor device according to a second embodiment;

FIG. 8 is a graph illustrating a voltage characteristic of the semiconductor device according to the second embodiment;

FIG. 9 is a cross-sectional view illustrating a semiconductor device according to a third embodiment;

FIG. 10 is a graph illustrating a voltage characteristic of the semiconductor device according to the third embodiment;

FIG. 11 is a graph illustrating a voltage-current characteristic of the semiconductor device according to an embodiment;

FIGS. 12 to 33 are cross-sectional views illustrating various modification examples of the semiconductor device according to the first embodiment; and FIGS. 34 to 40 are views illustrating various modification examples of the semiconductor device according to the third embodiment.

DETAILED DESCRIPTION OF THE PREFERRED EMBODIMENT

The present disclosure may be modified in various ways and may have various embodiments. Specific embodiments will be illustrated in the drawings and will be described below in detail. However, the present disclosure is not limited to the specific embodiments, and it should be understood that the present disclosure includes all modifications, equivalents, and substitutions which are included in the idea and scope of the present disclosure. In describing each drawing, similar reference numerals are assigned to similar components.

Terms such as first, second, A, and B may be used to describe various components, but the components should not be limited by the terms. The terms are used only for the purpose of distinguishing one component from other components. For example, a first component may be referred to as a second component without departing from the scope of the present disclosure. Similarly, the second component may be referred to as the first component. The term such as and/or includes a combination of a plurality of related items described herein or any one item of the plurality of related items described herein.

When it is described that a certain component is "coupled with" or "connected to" the other component, although the certain component is directly coupled with or connected to the other component, it should be understood that another component may exist therebetween. On the other hand, when it is described that a certain component is "directly coupled with" or "directly connected to" to the other component, it should be understood that another component does not exist therebetween.

Terms used in the present application are only used to describe specific embodiments, and are not intended to limit the present disclosure. Singular expressions include a plurality of expressions unless the context clearly indicates otherwise. In the present application, terms such as "include" or "have" are intended to indicate that a feature, number, step, operation, component, part, or combination thereof described herein exists. It should be understood that possibilities of one or more other existing or added features, numbers, steps, operations, components, parts, or combinations thereof are not excluded in advance.

Unless otherwise defined, all terms used herein, including technical or scientific terms, have meanings the same as those commonly understood by a person skilled in the art to which the present disclosure belongs. Terms such as those defined in a commonly used dictionary should be interpreted as having meanings consistent with meanings in the context of related technologies, and should not be interpreted as ideal or excessively formal meanings unless clearly defined in the present application.

Hereinafter, preferred embodiments according to the present disclosure will be described in detail with reference to the accompanying drawings.

FIG. 1 is a cross-sectional view illustrating a semiconductor device according to a first embodiment. FIGS. 2 and 3 are cross-sectional views illustrating an operation of the semiconductor device according to the first embodiment. FIG. 4 is a graph illustrating a voltage characteristic of the semiconductor device according to the first embodiment.

Referring to FIG. 1, a semiconductor device 100 according to the first embodiment may include a board 110, a gate electrode 120 disposed on the board 110, an insulation layer 130 disposed on the board 110, a threshold voltage control layer 140 disposed on the insulation layer 130, a first semiconductor layer 150 disposed on the threshold voltage control layer 140, a second semiconductor layer 160 disposed on the threshold voltage control layer 140 to cover a portion of the first semiconductor layer 150, a source electrode 170 formed on one side on the threshold voltage control layer 140, and a drain electrode 180 formed on the other side on the threshold voltage control layer 140.

The board 110 may include at least one of a silicon (Si) board, a germanium (Ge) board, a glass board, and a polyethylene terephthalate (PET) board, but is not limited thereto.

The gate electrode 120 may be disposed on a partial region of the board 110. The gate electrode 120 may be formed of titanium (Ti), platinum (Pt), gold (Au), palladium (Pd), chromium (Cr), molybdenum (Mo), super duralumin (Sd), and the like. In addition, any material having conductivity may be used for the gate electrode 120.

The insulation layer 130 may be disposed on the board 110. The insulation layer 130 may be disposed to surround the gate electrode 120. The insulation layer 130 may be in contact with a side surface of the gate electrode 120. A thickness of the insulation layer 130 may correspond to a thickness of the gate electrode 120. The insulation layer 130 may include at least one of silicon dioxide (SiO2), aluminum oxide (Al2O3), and hafnium oxide (HfO2), but is not limited thereto.

The threshold voltage control layer 140 may be disposed on the gate electrode 120 and the insulation layer 130. The threshold voltage control layer 140 may be in contact with an upper surface of the gate electrode 120. The threshold voltage control layer 140 may be in contact with an upper surface of the insulation layer 130. The thickness of the threshold voltage control layer 140 may be formed to be thicker than the thickness of the gate electrode 120. The threshold voltage control layer 140 may include a ferroelectric material. The threshold voltage control layer 140 may be formed in a thin film form on the gate electrode 120 and the insulation layer 130.

The threshold voltage control layer 140 may be formed of the ferroelectric material to generate a voltage trap or a polarization phenomenon. The ferroelectric material may be a material capable of controlling a gate voltage. In this manner, the threshold voltage control layer 140 may control a threshold voltage of a negative differential resistance device. The threshold voltage control layer 140 may have a memory function.

The first semiconductor layer 150 may be disposed on the threshold voltage control layer 140. The first semiconductor layer 150 may include a P-type semiconductor layer.

The first semiconductor layer 150 may include at least one of silicon, germanium (Ge), semiconductors for group III-V elements of the periodic table, organic semiconductors, non-organic oxide semiconductors, transition metal dichalcogenide, and phosphorene but is not limited thereto.

The second semiconductor layer 160 may be disposed on the threshold voltage control layer 140. A portion of the second semiconductor layer 160 may be formed to cover a portion of the first semiconductor layer 150. A portion of a lower surface of the second semiconductor layer 160 may be in contact with a portion of an upper surface of the first semiconductor layer 150. A side surface of the second semiconductor layer 160 may be in contact with a side surface of the first semiconductor layer 150. The first semiconductor layer 150 and the second semiconductor layer 160 may include a vertically and partially overlapping region.

The second semiconductor layer 160 may include an N-type semiconductor layer. The second semiconductor layer 160 may include at least one of silicon, germanium (Ge), semiconductors for group III-V elements of the periodic table, organic semiconductors, non-organic phosphorus oxide semiconductors, transition metal dichalcogenide, and rhenium disulfide (ReS2), but is not limited thereto.

A region where the first semiconductor layer 150 and the second semiconductor layer 160 overlap each other may vertically overlap the gate electrode 120. That is, the first semiconductor layer 150, the second semiconductor layer 160, and the gate electrode 120 may vertically overlap each other. A width of the gate electrode 120 may correspond to a width of the region where the first semiconductor layer 150 and the second semiconductor layer 160 overlap each other.

The source electrode 170 may be disposed on the threshold voltage control layer 140. The source electrode 170 may be disposed on one side of the upper surface of the threshold voltage control layer 140. A portion of the lower surface of the source electrode 170 may be in contact with the first semiconductor layer 150. A portion of the lower surface of the source electrode 170 may be in contact with the upper surface of the first semiconductor layer 150. The side surface of the source electrode 170 may be in contact with the side surface of the first semiconductor layer 150. That is, the source electrode 170 may be disposed to cover a portion of the side surface and the upper surface of the first semiconductor layer 150.

The source electrode 170 may be formed of at least one of titanium (Ti), aluminum (Al), erbium (Er), platinum (Pt), gold (Au), and palladium (Pd), but is not limited thereto.

The drain electrode 180 may be disposed on the threshold voltage control layer 140. The drain electrode 180 may be disposed on the other side of the upper surface of the threshold voltage control layer 140. A portion of the lower surface of the drain electrode 180 may be in contact with the second semiconductor layer 160. A portion of the lower surface of the drain electrode 180 may be in contact with the upper surface of the second semiconductor layer 160.

The side surface of the drain electrode 180 may be in contact with the side surface of the second semiconductor layer 160. That is, the drain electrode 180 may be disposed to cover a portion of the side surface and the upper surface of the second semiconductor layer 160.

The drain electrode 180 may be formed of at least one of titanium (Ti), aluminum (Al), erbium (Er), platinum (Pt), gold (Au), and palladium (Pd) but is not limited thereto.

As illustrated in FIG. 2, when a gate voltage of a positive polarity is applied, electrons may be generated in the threshold voltage control layer 140 adjacent to the gate electrode 120, and holes may be generated in the threshold voltage control layer 140 adjacent to the first semiconductor layer 150. Here, a region where the electrons and the holes are formed may be referred to as a trap layer.

As illustrated in FIG. 3, when a gate voltage of a negative polarity is applied, the holes may be generated in the threshold voltage control layer 140 adjacent to the gate electrode 120, and the electrons may be generated in the threshold voltage control layer 140 adjacent to the first semiconductor layer 150. Here, the region where the electrons and the holes are formed may be referred to as the trap layer.

As illustrated in FIG. 4, when the gate voltage of the positive polarity is applied, the threshold voltage may be lowered. On the other hand, when the gate voltage of the negative polarity is applied, the threshold voltage may be raised. In this manner, an operation voltage of the negative differential resistance device may vary.

The negative differential resistance device according to the embodiment has an advantageous effect in that the gate voltage enables a peak voltage to be freely controlled within an operation range of the device by forming the threshold voltage control layer.

The negative differential resistance device according to the embodiment causes the threshold voltage control layer to generate a voltage trap or a polarization phenomenon. In this manner, it is possible to control the threshold voltage of the negative differential resistance device.

Hereinafter, a manufacturing method of the semiconductor device according to the first embodiment will be described.

FIG. 5 is a block diagram illustrating the manufacturing method of the semiconductor device according to the first embodiment.

Referring to FIG. 5, the manufacturing method of the semiconductor device according to the first embodiment may include forming the insulation layer on the board (S100), forming the gate electrode on the board, forming the threshold voltage control layer on the first electrode and the insulation layer (S200), forming the first semiconductor layer on the threshold voltage control layer (S300), forming the second semiconductor layer on the threshold voltage control layer to cover a portion of the first semiconductor layer (S400), forming the source electrode on one side on the threshold voltage control layer, and forming the drain electrode on the other side on the threshold voltage control layer.

The insulation layer may be formed on the board (S100). The insulation layer may be formed by growing or depositing silicon dioxide (SiO2), aluminum oxide (Al2O3), and hafnium oxide (HfO2).

When the insulation layer is formed on the board, the gate electrode may be formed on the board. For the gate electrode, a portion of the insulation layer formed on the board may be removed so that the gate electrode is formed in the removed region. The gate electrode may be formed using an e-beam evaporation method, a thermal evaporator method, sputtering, or the like, but is not limited thereto.

In the above-described method, the gate electrode is formed after the insulation layer is formed on the board. However, without being limited thereto, the insulation layer may be formed after the gate electrode is formed.

When the gate electrode is formed on the board, the threshold voltage control layer may be formed (S200). The threshold voltage control layer may be formed by depositing the ferroelectric in a thin film form.

When the threshold voltage control layer is formed on the insulation layer, the first semiconductor layer may be formed on the threshold voltage control layer (S300). Representatively, the first semiconductor layer may be formed using methods such as chemical vapor deposition including low-pressure chemical vapor deposition and plasma-enhanced chemical vapor deposition in which at least one of silicon, germanium (Ge), semiconductors for group III-V elements of the periodic table, organic semiconductors, non-organic oxide semiconductors, transition metal dichalcogenide, and phosphorene is deposited on the threshold voltage control layer. Furthermore, the first semiconductor layer may be formed using a peeling method using a tape, a transfer method using a polymer, a solution-process, or the like.

When the first semiconductor layer is completely formed, the second semiconductor layer may be formed (S400). Representatively, the second semiconductor layer may be formed using methods such as chemical vapor deposition including low-pressure chemical vapor deposition and plasma-enhanced chemical vapor deposition in which at least one of silicon, germanium (Ge), semiconductors for group III-V elements of the periodic table, organic semiconductors, non-organic phosphorus oxide semiconductors, transition metal dichalcogenide, and rhenium disulfide (ReS2) is deposited on the threshold voltage control layer. Furthermore, the second semiconductor layer may be formed using a peeling method using a tape, a transfer method using a polymer, a solution-process, or the like.

When the second semiconductor layer is completely formed, the source electrode may be formed on one side on the threshold voltage control layer.

Representatively, the source electrode may be formed using methods such as chemical vapor deposition including low-pressure chemical vapor deposition and plasma-enhanced chemical vapor deposition in which at least one of titanium (Ti), aluminum (Al), erbium (Er), platinum (Pt), gold (Au), and palladium (Pd) is deposited on the threshold voltage control layer. Furthermore, the source electrode may be formed using a peeling method using a tape, a transfer method using a polymer, a solution-process, or the like. The embodiment is not limited thereto.

When the source electrode is completely formed, the drain electrode may be formed on the other side on the threshold voltage control layer.

Representatively, the drain electrode may be formed using methods such as chemical vapor deposition including low-pressure chemical vapor deposition and plasma-enhanced chemical vapor deposition in which at least one of titanium (Ti), aluminum (Al), erbium (Er), platinum (Pt), gold (Au), and palladium (Pd) is deposited on the threshold voltage control layer. Furthermore, the source electrode may be formed using a peeling method using a tape, a transfer method using a polymer, a solution-process, or the like. The embodiment is not limited thereto.

FIGS. 6 and 7 are cross-sectional views illustrating a semiconductor device according to a second embodiment, and FIG. 8 is a graph illustrating a voltage characteristic of the semiconductor device according to the second embodiment.

Referring to FIGS. 6 and 7, a semiconductor device 200 according to the second embodiment may include a board 210, an insulation layer 230 disposed on the board 210, a threshold voltage control layer 240 disposed on the insulation layer 230, a first semiconductor layer 250 disposed on the threshold voltage control layer 240, a second semiconductor layer 260 disposed on the threshold voltage control layer 240 to cover a portion of the first semiconductor layer 250, a source electrode 270 disposed on one side on the threshold voltage control layer 240, and a drain electrode 280 disposed on the other side on the threshold voltage control layer 240.

The board 210 may include at least one of a silicon (Si) board, a germanium (Ge) board, a glass board, and a polyethylene terephthalate (PET) board, but is not limited thereto. A gate voltage may be applied to the board 210. For this purpose, a gate electrode (not illustrated) may be disposed inside the board 210. The gate electrode may be disposed between the board and the insulation layer.

The insulation layer 230 may be disposed on the board 210. The insulation layer 230 may include at least one of silicon dioxide (SiO2), aluminum oxide (Al2O3), and hafnium oxide (HfO2), but is not limited thereto.

The threshold voltage control layer 240 may be disposed on the insulation layer 230. The threshold voltage control layer 240 may include a graphene (h-BN) material. The threshold voltage control layer 240 may be formed of a graphene material subjected to plasma treatment. The threshold voltage control layer 240 may be formed in a thin film form on the insulation layer 230.

The threshold voltage control layer 240 may be formed of the graphene material to generate a voltage trap or a polarization phenomenon. In this manner, the threshold voltage control layer 240 may control a threshold voltage of the negative differential resistance device. The threshold voltage control layer 240 may have a memory function.

The first semiconductor layer 250 may be disposed on the threshold voltage control layer 240. The first semiconductor layer 250 may include a P-type semiconductor layer. The second semiconductor layer 260 may be disposed on the threshold voltage control layer 240. A portion of the second semiconductor layer 260 may be formed to cover a portion of the first semiconductor layer 250. The second semiconductor layer 260 may include an N-type semiconductor layer. The first semiconductor layer 250 and the second semiconductor layer 260 may include a vertically and partially overlapping region.

The source electrode 260 may be disposed on one side of the upper surface of the threshold voltage control layer 240. The source electrode 260 may be disposed to cover a portion of the side surface and the upper surface of the first semiconductor layer 250. The drain electrode 280 may be disposed on the other side of the upper surface of the threshold voltage control layer 240. A portion of the lower surface of the drain electrode 280 may be in contact with the second semiconductor layer 260.

The source electrode 270 and the drain electrode 280 may be formed of at least one of titanium (Ti), aluminum (Al), erbium (Er), platinum (Pt), gold (Au), and palladium (Pd), but is not limited thereto.

As illustrated in FIG. 6, when a gate voltage is applied, electrons may be trapped in a region of the threshold voltage control layer 240 adjacent to the first semiconductor layer 250.

On the other hand, as illustrated in FIG. 7, when the gate voltage is applied, holes may be trapped in a region of the threshold voltage control layer 240 adjacent to the first semiconductor layer 250.

As illustrated in FIG. 8, when the electrons are trapped, a threshold voltage is lowered, and when the holes are trapped, the threshold voltage is raised. In this manner, the threshold voltage may be controlled.

FIG. 9 is a cross-sectional view illustrating a semiconductor device according to a third embodiment, and FIG. 10 is a graph illustrating a voltage characteristic of the semiconductor device according to the third embodiment.

As illustrated in FIG. 9, a semiconductor device 300 according to the third embodiment may include a board 310, a gate electrode 320 disposed on the board 310, a threshold voltage control layer 340 disposed on the gate electrode 320, an insulation layer 330 disposed on the board 310, the first semiconductor layer 350 disposed on the insulation layer 330 and the threshold voltage control layer 340, and a second semiconductor layer 360 disposed on the first semiconductor layer 350. Here, the source electrode and the drain electrode have configurations which are the same as those of the semiconductor device according to the first embodiment. Accordingly, the description thereof will be omitted.

The board 310 may be formed of at least one of a silicon (Si) board, a germanium (Ge) board, a glass board, and a polyethylene terephthalate (PET) board, but is not limited thereto.

The gate electrode 320 may be disposed on a partial region of the board 310. The gate electrode 320 may be formed of titanium (Ti), platinum (Pt), gold (Au), palladium (Pd), chromium (Cr), molybdenum (Mo), and super duralumin (Sd). In addition, any material having conductivity may be used for the gate electrode 320.

The threshold voltage control layer 340 may be disposed on the gate electrode 320. The threshold voltage control layer 340 may include a ferroelectric material or a graphene material subjected to plasma treatment.

The insulation layer 330 may be disposed on the board 310. The insulation layer 330 may be disposed on the side surface of the gate electrode 320 and on the side surface of the threshold voltage control layer 340. The insulation layer 330 may be in contact with the side surface of the gate electrode 320 and the side surface of the threshold voltage control layer 340.

The thickness of the insulation layer 330 may be formed to be thicker than the thickness of the gate electrode 320. The thickness of the insulation layer 330 may be formed to be thicker than the thickness of the threshold voltage control layer 340. The thickness of the insulation layer 330 may correspond to the sum of the thickness of the gate electrode 320 and the thickness of the threshold voltage control layer 340. The insulation layer 330 may include at least one of silicon dioxide ($SiO_2$), aluminum oxide ($Al_2O_3$), and hafnium oxide ($HfO_2$), but is not limited thereto.

The first semiconductor layer 350 may be disposed on the threshold voltage control layer 340. The lower surface of the first semiconductor layer 350 may be in contact with the upper surface of the insulation layer 330. The lower surface of the first semiconductor layer 350 may be in contact with the upper surface of the threshold voltage control layer 340. The second semiconductor layer 360 may be disposed on the first semiconductor layer 350. The first semiconductor layer 350 may include a P-type semiconductor layer. The second semiconductor layer 360 may include an N-type semiconductor layer.

According to the embodiment, a structure that may be controlled by the gate voltage is implemented only in a portion of a channel region or a junction region of the negative differential resistance device. Accordingly, two or more negative differential resistance devices having mutually different properties in one device may be implemented.

In addition, according to the embodiment, a peak-valley position and the number of the negative differential resistance devices may be controlled in accordance with a magnitude of the gate voltage. Accordingly, when a memory unit device is implemented, a state and the number of memories may be changed only by using the gate voltage.

Through the negative differential resistance device having multiple peaks, memory/multi-valued logic devices having multiple states may be implemented. In addition, a characteristic of the negative differential resistance device is changed only by applying an additional voltage for implementing the negative differential resistance device having multiple peaks. Therefore, the system and circuit design may be flexibly achieved.

FIG. 11 is a graph illustrating a voltage-current characteristic of the semiconductor device according to an embodiment.

As illustrated in FIG. 11, it may be understood that three operation points are implemented when viewing a voltage-current characteristic curve of the negative differential resistance device having two peak voltages.

This allows an advantageous effect equivalent to a case where two or more negative differential resistance devices are coupled in parallel in one device. Therefore, the negative differential resistance device having multiple peaks may be implemented in terms of an operation characteristic.

Hereinafter, various modification examples of the semiconductor devices according to the embodiment will be described.

FIGS. 12 to 33 are cross-sectional views illustrating various modification examples of the semiconductor device according to the first embodiment, and FIGS. 34 to 40 are views illustrating various modification examples of the semiconductor device according to the third embodiment.

Referring to FIGS. 12 to 33, the semiconductor device may include the board 110, the insulation layer 130 disposed on the board 110, the gate electrode 120 formed on the insulation layer 130, the trap layer 190 formed on the gate electrode 120, the threshold voltage control layer 140 formed on the insulation layer, the first semiconductor layer 150 formed on the threshold voltage control layer 140 and the trap layer 190, the second semiconductor layer 160 disposed on the threshold voltage control layer 140 to cover a portion of the first semiconductor layer 150, the source electrode 170 disposed on the first semiconductor layer 150, and the drain electrode 180 formed on the second semiconductor layer 160.

As illustrated in FIGS. 12 and 13, the gate electrode 120 may be formed on a partial region of the upper portion of the insulation layer 130. The gate electrode 120 may be disposed to vertically and partially overlap the source electrode 170. The trap layer 190 may be disposed between the gate electrode 120 and the first semiconductor layer 150. The width of the trap layer 190 may correspond to the width of the gate electrode 120. The trap layer 190 may be surrounded by the threshold voltage control layer 140. The trap layer 190 may be disposed to vertically and partially overlap the source electrode 170.

As illustrated in FIG. 12, when a positive electrode is applied to the gate electrode 120, the trap layer 190 may have a negative charge. As illustrated in FIG. 13, when a negative electrode is applied to the gate electrode 120, the trap layer 190 may have a positive charge.

As illustrated in FIGS. 14 and 15, the gate electrode 120 may be formed on a partial region of the upper portion of the insulation layer 130. The trap layer 190 may be disposed between the gate electrode 120 and the second semiconductor layer 160. The width of the trap layer 190 may correspond to the width of the gate electrode 120. The trap layer 190 may be in contact with the front surface of the lower surface of the second semiconductor layer 160.

As illustrated in FIG. 14, when the positive electrode is applied to the gate electrode 120, the trap layer 190 may have the negative charge. As illustrated in FIG. 15, when the negative electrode is applied to the gate electrode 120, the trap layer 190 may have the positive charge.

As illustrated in FIGS. 16 and 17, the gate electrode 120 may be formed on a partial region of the upper portion of the insulation layer 130. The gate electrode 120 may be disposed to vertically and partially overlap the drain electrode 180. The trap layer 190 may be disposed between the gate electrode 120 and the first semiconductor layer 150. The width of the trap layer 190 may correspond to the width of the gate electrode 120. The trap layer 190 may be surrounded by the threshold voltage control layer 140. The trap layer 190 may be disposed to vertically and partially overlap the drain electrode 180.

As illustrated in FIG. 16, when the positive electrode is applied to the gate electrode 120, the trap layer 190 may have the negative charge. As illustrated in FIG. 17, when the negative electrode is applied to the gate electrode 120, the trap layer 190 may have the positive charge.

As illustrated in FIGS. 18 and 19, the gate electrode 120 may be formed on a partial region of the upper portion of the insulation layer 130. The gate electrode 120 may be disposed to vertically and partially overlap the source electrode 170. The gate electrode 120 may be disposed to vertically and partially overlap the drain electrode 180. The trap layer 190 may be disposed between the gate electrode 120 and the first semiconductor layer 150. The width of the trap layer 190 may correspond to the width of the gate electrode 120. The trap layer 190 may be surrounded by the threshold voltage control layer 140. The trap layer 190 may be disposed to vertically and partially overlap the source electrode 170 and the drain electrode 180.

As illustrated in FIG. 18, when the positive electrode is applied to the gate electrode 120, the trap layer 190 may have the negative charge. As illustrated in FIG. 19, when the negative electrode is applied to the gate electrode 120, the trap layer 190 may have the positive charge.

As illustrated in FIGS. 20 and 21, the gate electrode 120 may be formed on a partial region of the upper portion of the insulation layer 130. The gate electrode 120 may be disposed to vertically and partially overlap the drain electrode 180. The trap layer 190 may be disposed between the gate electrode 120 and the first semiconductor layer 150. The width of the trap layer 190 may correspond to the width of the gate electrode 120. The trap layer 190 may be surrounded by the threshold voltage control layer 140. The trap layer 190 may be disposed to vertically and partially overlap the drain electrode 180. The trap layer 190 may be in contact with the lower surfaces of the first semiconductor layer 150 and the second semiconductor layer 160.

As illustrated in FIG. 20, when the positive electrode is applied to the gate electrode 120, the trap layer 190 may have the negative charge. As illustrated in FIG. 21, when the negative electrode is applied to the gate electrode 120, the trap layer 190 may have the positive charge.

As illustrated in FIGS. 22 and 23, the gate electrode 120 may be formed on a partial region of the upper portion of the insulation layer 130. The gate electrode 120 may be disposed to vertically and partially overlap the source electrode 170. The gate electrode 120 may be disposed to vertically and partially overlap the drain electrode 180. The trap layer 190 may be disposed between the gate electrode 120 and the first semiconductor layer 150. The width of the trap layer 190 may correspond to the width of the gate electrode 120. The trap layer 190 may be surrounded by the threshold voltage control layer 140. The trap layer 190 may be disposed to vertically and partially overlap the source electrode 170 and the drain electrode 180. The trap layer 190 may be in contact with the entire surface of the lower portion of the first semiconductor layer 150 and the entire surface of the lower portion of the second semiconductor layer 160.

As illustrated in FIG. 22, when the positive electrode is applied to the gate electrode 120, the trap layer 190 may have the negative charge. As illustrated in FIG. 23, when the negative electrode is applied to the gate electrode 120, the trap layer 190 may have the positive charge.

As illustrated in FIGS. 24 and 25, the gate electrode 120 may be formed on a partial region of the upper portion of the insulation layer 130. The gate electrode 120 may be disposed to vertically and partially overlap the source electrode 170. The trap layer 190 may be disposed between the gate electrode 120 and the first semiconductor layer 150. The width of the trap layer 190 may correspond to the width of the gate electrode 120. The trap layer 190 may be surrounded by the threshold voltage control layer 140. The trap layer 190 may be disposed to vertically and partially overlap the source electrode 170.

As illustrated in FIG. 24, when the positive electrode is applied to the gate electrode 120, the trap layer 190 may have two polarities. The trap layer 190 may have the negative charge and the positive charge in an order adjacent to the gate electrode 120. As illustrated in FIG. 25, when the negative electrode is applied to the gate electrode 120, the trap layer 190 may have the positive charge and the negative charge in an order adjacent to the gate electrode 120.

As illustrated in FIGS. 26 and 27, the gate electrode 120 may be formed on a partial region of the upper portion of the insulation layer 130. The trap layer 190 may be disposed between the gate electrode 120 and the second semiconductor layer 160. The width of the trap layer 190 may correspond to the width of the gate electrode 120. The trap layer 190 may be in contact with the front surface of the lower surface of the second semiconductor layer 160.

As illustrated in FIG. 26, when the positive electrode is applied to the gate electrode 120, the trap layer 190 may have two polarities. The trap layer 190 may have the negative charge and the positive charge in the order adjacent to the gate electrode 120. As illustrated in FIG. 27, when the negative electrode is applied to the gate electrode 120, the trap layer 190 may have the positive charge and the negative charge in the order adjacent to the gate electrode 120.

As illustrated in FIGS. 28 and 29, the gate electrode 120 may be formed on a partial region of the upper portion of the insulation layer 130. The gate electrode 120 may be disposed to vertically and partially overlap the source electrode 170. The gate electrode 120 may be disposed to vertically and partially overlap the drain electrode 180. The trap layer 190 may be disposed between the gate electrode 120 and the first semiconductor layer 150. The width of the trap layer 190 may correspond to the width of the gate electrode 120. The trap layer 190 may be surrounded by the threshold voltage control layer 140. The trap layer 190 may be disposed to vertically and partially overlap the source electrode 170 and the drain electrode 180.

As illustrated in FIG. 28, when the positive electrode is applied to the gate electrode 120, the trap layer 190 may have two polarities. The trap layer 190 may have the negative charge and the positive charge in the order adjacent to the gate electrode 120. As illustrated in FIG. 29, when the negative electrode is applied to the gate electrode 120, the trap layer 190 may have the positive charge and the negative charge in the order adjacent to the gate electrode 120.

As illustrated in FIGS. 30 and 31, the gate electrode 120 may be formed on a partial region of the upper portion of the insulation layer 130. The gate electrode 120 may be disposed to vertically and partially overlap the drain electrode 180. The trap layer 190 may be disposed between the gate electrode 120 and the first semiconductor layer 150. The width of the trap layer 190 may correspond to the width of the gate electrode 120. The trap layer 190 may be surrounded by the threshold voltage control layer 140. The trap layer 190 may be disposed to vertically and partially overlap the drain electrode 180. The trap layer 190 may be in contact with the lower surface of the first semiconductor layer 150 and the second semiconductor layer 160.

As illustrated in FIG. 30, when the positive electrode is applied to the gate electrode 120, the trap layer 190 may have two polarities. The trap layer 190 may have the negative charge and the positive charge in an order adjacent to the gate electrode 120. As illustrated in FIG. 31, when the negative electrode is applied to the gate electrode 120, the trap layer 190 may have the positive charge and the negative charge in the order adjacent to the gate electrode 120.

As illustrated in FIGS. 32 and 33, the gate electrode 120 may be formed on a partial region of the upper portion of the insulation layer 130. The gate electrode 120 may be disposed to vertically and partially overlap the source electrode 170. The gate electrode 120 may be disposed to vertically and partially overlap the drain electrode 180. The trap layer 190 may be disposed between the gate electrode 120 and the first semiconductor layer 150. The width of the trap layer 190 may correspond to the width of the gate electrode 120. The trap layer 190 may be surrounded by the threshold voltage control layer 140. The trap layer 190 may be disposed to vertically and partially overlap the source electrode 170 and the drain electrode 180. The trap layer 190 may be in contact with the entire surface of the lower portion of the first semiconductor layer 150 and the entire surface of the lower portion of the second semiconductor layer 160.

As illustrated in FIG. 32, when the positive electrode is applied to the gate electrode 120, the trap layer 190 may have two polarities. The trap layer 190 may have the negative charge and the positive charge in an order adjacent to the gate electrode 120. As illustrated in FIG. 33, when the negative electrode is applied to the gate electrode 120, the trap layer 190 may have the positive charge and the negative charge in the order adjacent to the gate electrode 120.

As illustrated in FIGS. 34 and 35, the semiconductor device may include the board 310, the gate electrode 320 disposed on the board 310, the trap layer 390 disposed on the gate electrode 320, the insulation layer 330 disposed on the board 310, the first semiconductor layer 350 disposed on the insulation layer 330 and the trap layer 390, and the second semiconductor layer 360 disposed on the first semiconductor layer 350.

The side surface of the insulation layer 330 may be in contact with the side surface of the gate electrode 320. The side surface of the insulation layer 330 may be in contact with the side surface of the trap layer 390.

As illustrated in FIG. 34, the trap layer 390 may have the negative charge due to a bias voltage applied to the gate electrode 320. As illustrated in FIG. 35, the trap layer 390 may have the positive charge due to the bias voltage applied to the gate electrode 320.

As illustrated in FIGS. 36 and 37, the semiconductor device may include the board 310, a plurality of the gate electrodes 320 disposed on the board 310, a plurality of the trap layers 390 disposed on the plurality of gate electrodes 320, the first semiconductor layer 350 disposed on the trap layer 390, and the second semiconductor layer 360 disposed on the first semiconductor layer 350.

The gate electrode 320 and the trap layer 390 may be formed in pairs. The gate electrode 320 and the trap layer 390 may be disposed apart from each other.

As illustrated in FIG. 36, the trap layer 390 may have the negative charge. The trap layer 390 disposed apart therefrom may have the positive charge. This may be determined by the bias voltage applied to the gate electrode 320.

As illustrated in FIG. 37, the gate electrode 320 and the trap layer 390 may be formed so that three or more layers are disposed apart from each other.

As illustrated in FIGS. 38 and 39, the semiconductor device may include the board 310, the gate electrode 320 disposed on the board 310, the trap layer 390 disposed on the gate electrode 320, the insulation layer 330 disposed on the board 310, the first semiconductor layer 350 disposed on the insulation layer 330 and the trap layer 390, and the second semiconductor layer 360 disposed on the first semiconductor layer 350.

The side surface of the insulation layer 330 may be in contact with the side surface of the gate electrode 320. The side surface of the insulation layer 330 may be in contact with the side surface of the trap layer 390.

As illustrated in FIG. 38, the trap layer 390 may be formed to have the negative charge and the positive charge in the order adjacent to the gate electrode 320 due to the bias voltage applied to the gate electrode 320. As illustrated in FIG. 39, the trap layer 390 may have the positive charge and the negative charge due to the bias voltage applied to the gate electrode 320.

As illustrated in FIG. 40, the semiconductor device may include the board 310, a plurality of the gate electrodes 320 disposed on the board 310, a plurality of the trap layers 390 disposed on the plurality of gate electrodes 320, the first semiconductor layer 350 disposed on the trap layer 390, and the second semiconductor layer 360 disposed on the first semiconductor layer 350.

The gate electrode 320 and the trap layer 390 may be formed in pairs. The gate electrode 320 and the trap layer 390 may be disposed apart from each other.

The trap layer 390 may be formed to have two polarities. At least one of the trap layers 390 may have the negative charge and the positive charge in the order adjacent to the gate electrode 320. The other one of the trap layers 390 may have the positive charge and the negative charge in the order adjacent to the gate electrode 320.

What is claimed is:

1. A semiconductor device comprising:
   a planar board;
   an insulation layer disposed on the planar board;
   a planar threshold voltage control layer disposed on the insulation layer;
   a first semiconductor layer disposed directly on the planar threshold voltage control layer different from the first semiconductor layer;
   a second semiconductor layer disposed directly on the planar threshold voltage control layer and the first semiconductor layer to cover a portion of the first semiconductor layer; and
   a source electrode disposed directly on the planar threshold voltage control layer and the first semiconductor layer to cover another portion of the first semiconductor layer.

2. The semiconductor device of claim 1, wherein the planar threshold voltage control layer includes a ferroelectric.

3. The semiconductor device of claim 2, further comprising:
   A gate electrode disposed on the planar board,
   wherein the gate electrode is disposed and surrounded by the insulation layer.

4. The semiconductor device of claim 3, wherein the gate electrode is disposed and vertically overlapped with the first semiconductor layer and the second semiconductor layer.

5. The semiconductor device of claim 4, wherein a width of the gate electrode corresponds to a width of a region where the first semiconductor layer and the second semiconductor layer overlap each other.

6. The semiconductor device of claim 1, wherein the planar threshold voltage control layer includes graphene subjected to plasma treatment.

7. The semiconductor device of claim 6, further comprising:
   a gate electrode disposed between the planar board and the insulation layer.

8. The semiconductor device of claim 1, further comprising:
   a drain electrode disposed directly on the planar threshold voltage control layer and the second semiconductor layer to cover a portion of the second semiconductor layer.

9. The semiconductor device of claim 2, further comprising:
   A gate electrode disposed on the planar board,
   wherein the gate electrode is disposed on the insulation layer.

10. The semiconductor device of claim 9, wherein a trap layer is formed between the gate electrode and the first semiconductor layer.

11. The semiconductor device of claim 10, wherein the trap layer is disposed and partially or entirely overlapped with the first semiconductor layer.

12. The semiconductor device of claim 10, wherein the trap layer includes one polarity or two polarities.

13. The semiconductor device of claim 9, wherein a trap layer is formed between the gate electrode and the second semiconductor layer.

14. The semiconductor device of claim 9, wherein a trap layer is formed between the gate electrode and the first semiconductor layer and the second semiconductor layer.

* * * * *